US006990420B2

(12) United States Patent
Guo et al.

(10) Patent No.: US 6,990,420 B2
(45) Date of Patent: Jan. 24, 2006

(54) METHOD OF ESTIMATING A LOCAL AVERAGE CROSSTALK VOLTAGE FOR A VARIABLE VOLTAGE OUTPUT RESISTANCE MODEL

(75) Inventors: Weiqing Guo, Fremont, CA (US);
Sandeep Bhutani, Milpitas, CA (US);
Qian Cui, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 33 days.

(21) Appl. No.: 10/842,879

(22) Filed: May 10, 2004

(65) Prior Publication Data

US 2005/0251354 A1 Nov. 10, 2005

(51) Int. Cl.
*G06F 17/50* (2006.01)
(52) U.S. Cl. .......................... 702/79; 714/733; 716/1; 716/4; 716/5; 716/6
(58) Field of Classification Search ................ 702/79; 714/733; 716/1, 4, 5, 6
See application file for complete search history.

(56) References Cited

U.S. PATENT DOCUMENTS

| | | | | |
|---|---|---|---|---|
| 5,535,133 A | * | 7/1996 | Petschauer et al. | 716/19 |
| 5,555,506 A | * | 9/1996 | Petschauer et al. | 703/13 |
| 5,596,506 A | * | 1/1997 | Petschauer et al. | 716/5 |
| 6,378,109 B1 | * | 4/2002 | Young et al. | 716/4 |
| 6,499,131 B1 | * | 12/2002 | Savithri et al. | 716/5 |
| 6,543,043 B1 | * | 4/2003 | Wang et al. | 716/14 |
| 6,594,805 B1 | * | 7/2003 | Tetelbaum et al. | 716/5 |
| 6,637,014 B2 | * | 10/2003 | Casavant | 716/6 |
| 6,836,873 B1 | * | 12/2004 | Tseng et al. | 716/4 |
| 6,907,586 B1 | * | 6/2005 | Al-Dabagh et al. | 716/5 |
| 2002/0166101 A1 | * | 11/2002 | Casavant | 716/6 |
| 2003/0115563 A1 | * | 6/2003 | Chen | 716/5 |
| 2003/0229873 A1 | * | 12/2003 | Casavant | 716/6 |
| 2004/0243956 A1 | * | 12/2004 | Tetelbaum et al. | 716/6 |
| 2005/0022145 A1 | * | 1/2005 | Tetelbaum et al. | 716/6 |
| 2005/0060675 A1 | * | 3/2005 | Tetelbaum | 716/5 |
| 2005/0102594 A1 | * | 5/2005 | Dey et al. | 714/733 |

* cited by examiner

*Primary Examiner*—Carol S. W. Tsai
(74) *Attorney, Agent, or Firm*—Fitch, Even, Tabin & Flannery

(57) ABSTRACT

A method includes steps of: (a) receiving as input a waveform of a transient signal as a function of time for an aggressor net; (b) finding a peak value of the waveform and a corresponding peak time of the waveform propagated from the aggressor net to a victim net; (c) defining a selected time interval within the waveform at the victim net that includes the peak value and excludes features of the waveform not associated with the peak value wherein the selected time interval begins at a first time and ends at a second time; (d) calculating a weighted value of a function of the waveform at the first time and the second time; (e) calculating a local average value of the waveform as a function of the peak value and the weighted value; and (f) generating as output the local average value of the waveform.

19 Claims, 5 Drawing Sheets

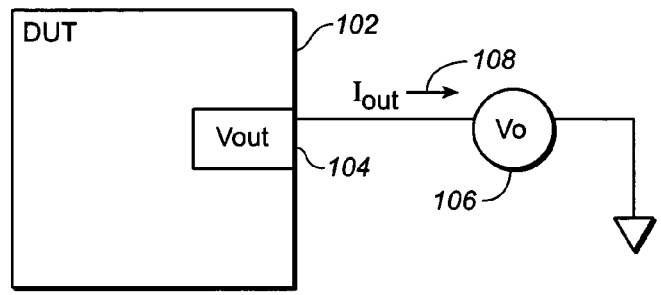
FIG._1
(PRIOR ART)
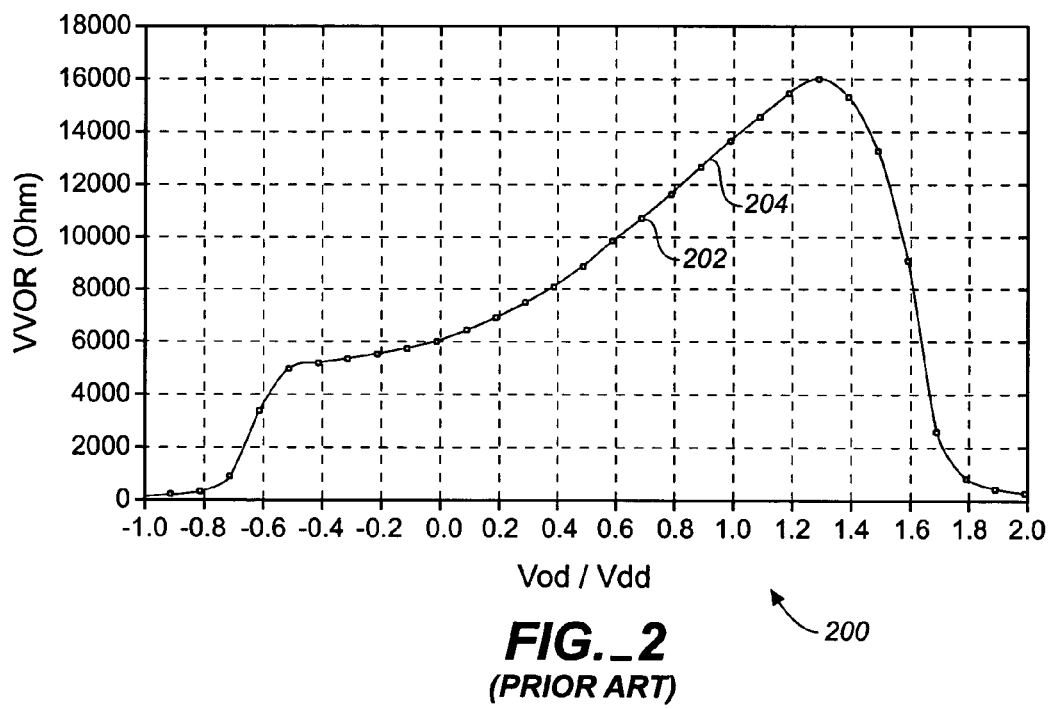
FIG._2
(PRIOR ART)

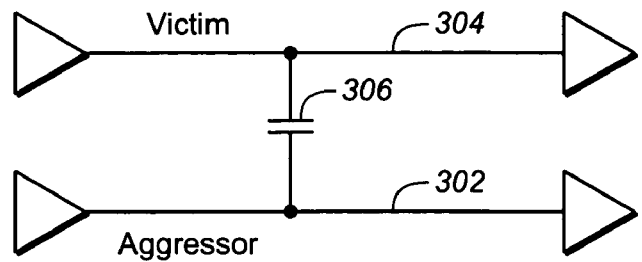
FIG._3
*(PRIOR ART)*
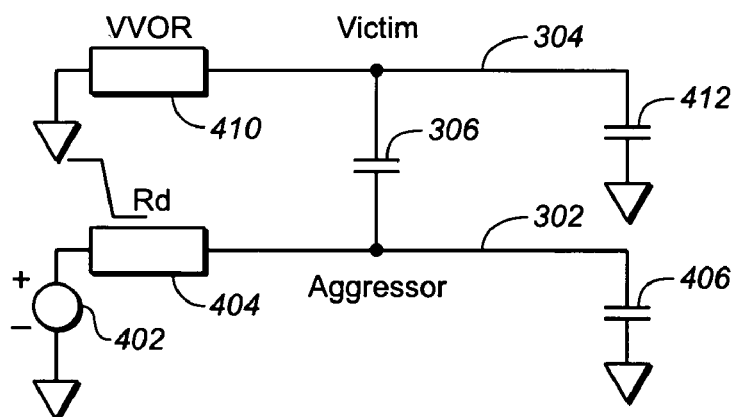
FIG._4
*(PRIOR ART)*
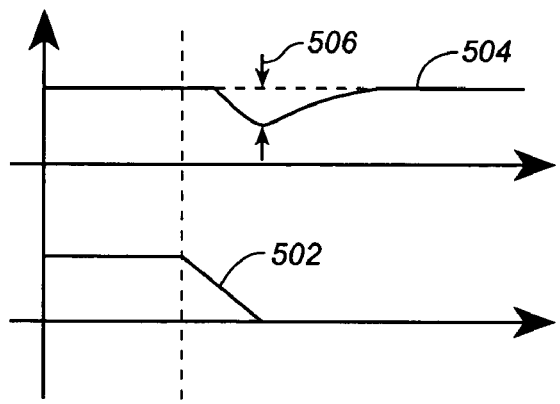
FIG._5
*(PRIOR ART)*

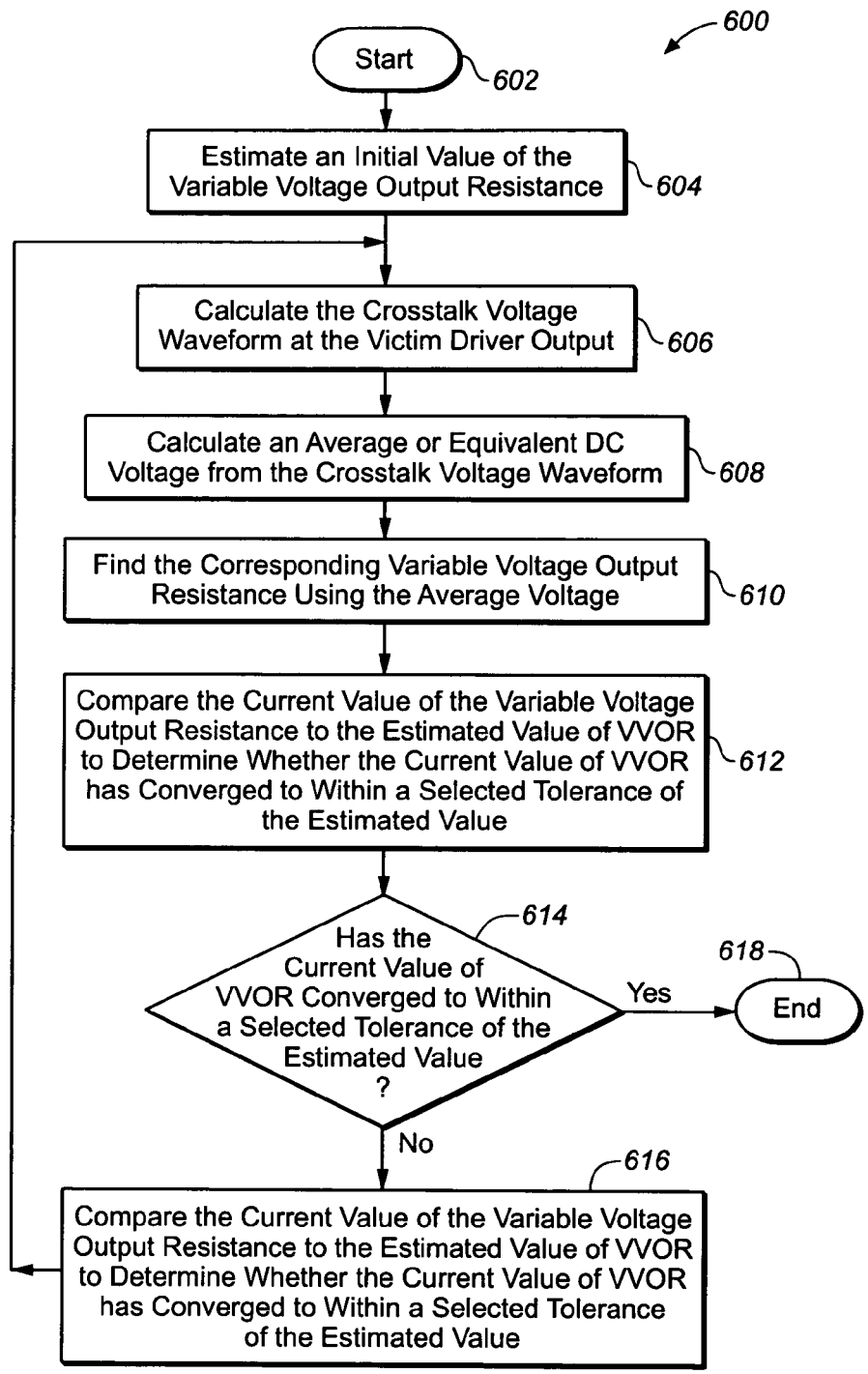
FIG._6

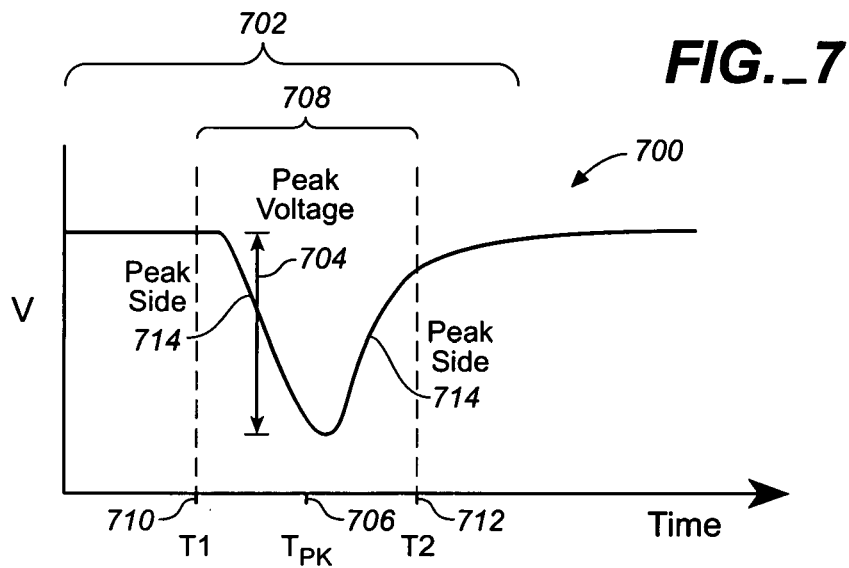
FIG._7
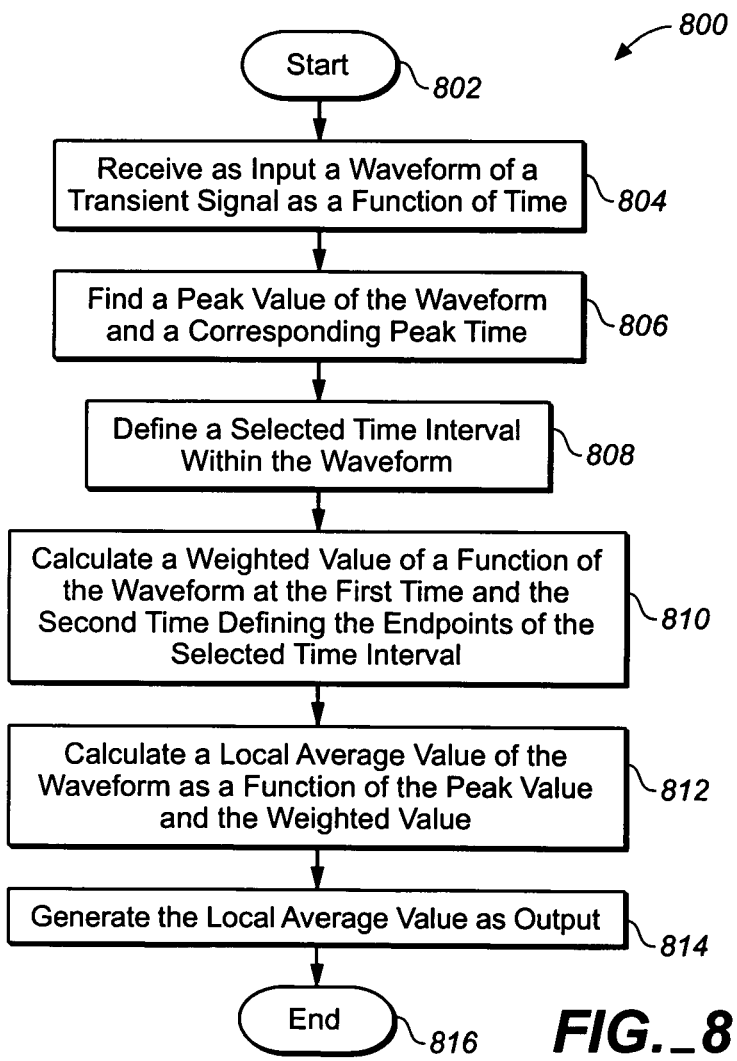
FIG._8

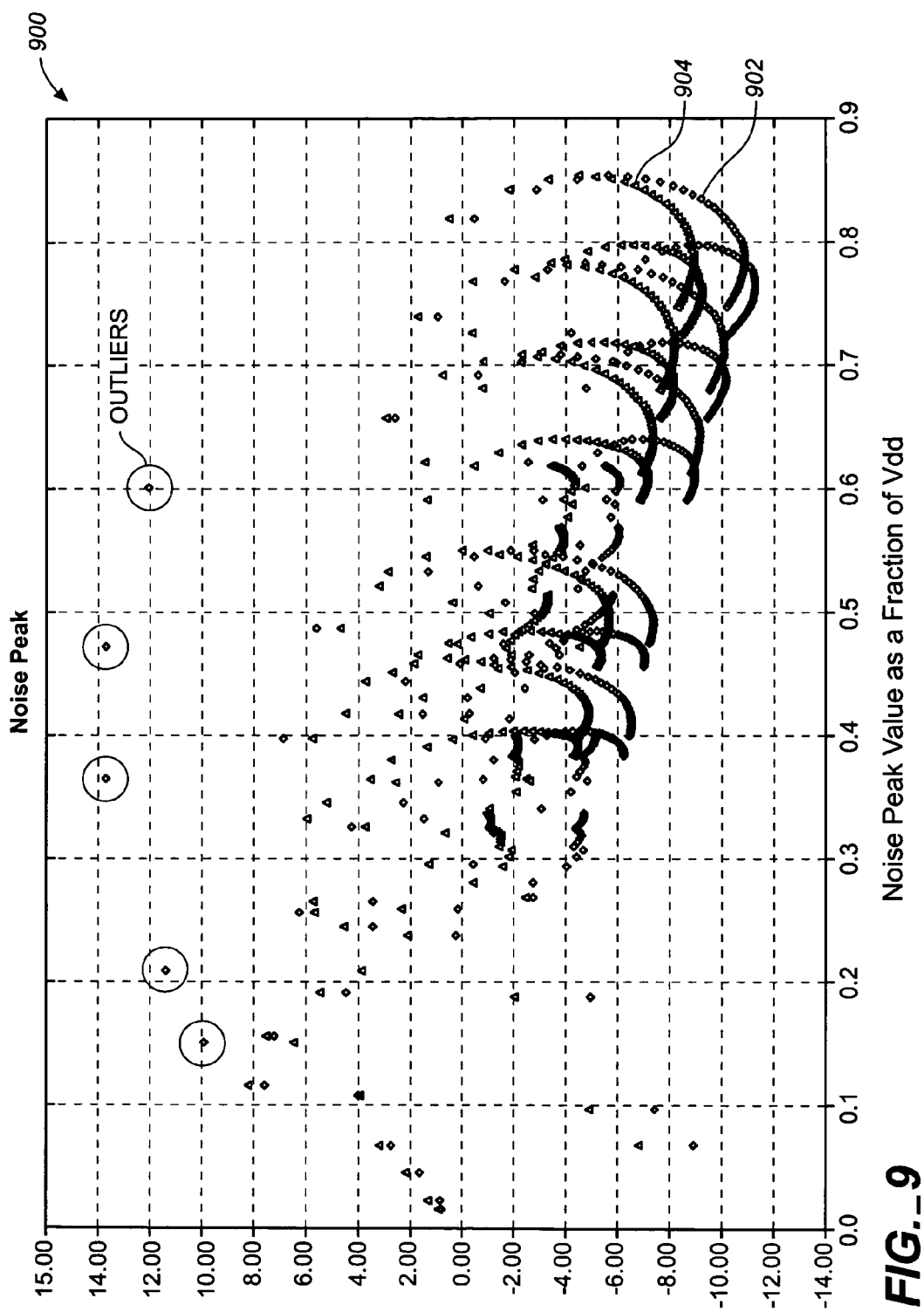
FIG._9

METHOD OF ESTIMATING A LOCAL AVERAGE CROSSTALK VOLTAGE FOR A VARIABLE VOLTAGE OUTPUT RESISTANCE MODEL

BACKGROUND OF THE INVENTION

1. Field of the Invention

The present invention is directed to the design of integrated circuits. More specifically, but without limitation thereto, the present invention is directed to estimating crosstalk between an aggressor net and a victim net in an integrated circuit design.

2. Description of Related Art

In the design of integrated circuits using deep sub-micron technology, crosstalk analysis plays a critical role in predicting the performance of the final product. The accuracy of the crosstalk analysis is determined by the accuracy of the model used to estimate crosstalk propagated from an aggressor net to a victim net in an integrated circuit design. A preferred model for estimating crosstalk is the variable voltage output resistance (VVOR) model. The VVOR model accounts for the non-linear variation in the output resistance vs. voltage measured at the output of a driver cell. In a typical crosstalk model, a crosstalk waveform is calculated using an initial estimate of VVOR at the output of the victim net driver cell. An average crosstalk voltage is calculated from the crosstalk waveform, and the average crosstalk voltage is used to find a new value of VVOR from the measured VVOR curve. If the new value of VVOR is not equal to the initial VVOR estimate within a desired tolerance, then the initial estimate is replaced with the new value. The crosstalk waveform and the average crosstalk voltage are recalculated, and the corresponding value of VVOR is compared to the previous value until the value of VVOR has converged to the desired tolerance.

SUMMARY OF THE INVENTION

In one embodiment of the present invention, a method includes steps of:
(a) receiving as input a waveform of a transient signal as a function of time for an aggressor net;
(b) finding a peak value of the waveform and a corresponding peak time of the waveform propagated to a victim net from the aggressor net;
(c) defining a selected time interval within the waveform at the victim net that includes the peak value and excludes features of the waveform not associated with the peak value wherein the selected time interval begins at a first time and ends at a second time;
(d) calculating a weighted value of a function of the waveform at the first time and the second time;
(e) calculating a local average value of the waveform as a function of the peak value and the weighted value; and
(f) generating as output the local average value of the waveform.

In another embodiment of the present invention, a method of estimating a local average crosstalk voltage for a variable voltage output resistance model includes steps of:
(a) receiving as input a crosstalk voltage waveform propagated from an aggressor net to a victim net;
(b) finding a peak voltage value and a corresponding peak time in the crosstalk voltage waveform at the victim net;
(c) defining a selected time interval within the crosstalk voltage waveform that includes the peak voltage value and excludes features of the crosstalk voltage waveform not associated with the peak voltage value wherein the selected time interval begins at a first time and ends at a second time;
(d) calculating a weighted value of a function of the crosstalk voltage waveform at the first time and the second time;
(e) calculating a local average crosstalk voltage as a function of the peak voltage value and the weighted value; and
(f) generating as output the local average crosstalk voltage.

In a further embodiment of the present invention, a computer program product for estimating a local average crosstalk voltage for a variable voltage output resistance model includes:
a medium for embodying a computer program for input to a computer; and
a computer program embodied in the medium for causing the computer to perform steps of:
(a) receiving as input a crosstalk voltage waveform propagated from an aggressor net to a victim net;
(b) finding a peak voltage value and a corresponding peak time in the crosstalk voltage waveform at the victim net;
(c) defining a selected time interval within the crosstalk voltage waveform that includes the peak voltage value and excludes features of the crosstalk voltage waveform not associated with the peak voltage value wherein the selected time interval begins at a first time and ends at a second time;
(d) calculating a weighted value of a function of the crosstalk voltage waveform at the first time and the second time;
(e) calculating a local average crosstalk voltage as a function of the peak voltage value and the weighted value; and
(f) generating as output the local average crosstalk voltage.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a variable voltage output resistance (VVOR) model of the prior art;

FIG. 2 illustrates a typical plot of variable voltage output resistance as a function of the applied DC voltage 106 for the VVOR model of FIG. 1;

FIG. 3 illustrates an aggressor net and a victim net used for crosstalk analysis according to the prior art;

FIG. 4 illustrates a variable voltage output resistance crosstalk model of the prior art for the aggressor net and the victim net of FIG. 3;

FIG. 5 illustrates a plot of the crosstalk voltage waveform in response to a switching transient as a function of time for FIG. 4;

FIG. 6 illustrates a flow chart for a method of determining the variable voltage output resistance in a crosstalk analysis model according to the prior art;

FIG. 7 illustrates a plot of a crosstalk voltage waveform at the victim net according to an embodiment of the present invention;

FIG. 8 illustrates a flow chart of a method of estimating a local average crosstalk voltage for a variable voltage output resistance model according to an embodiment of the present invention; and FIG. 9 illustrates a plot of VVOR error in a SPICE simulation as a function of crosstalk peak voltage.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

FIG. 1 illustrates a variable voltage output resistance (VVOR) model 100 of the prior art. Shown in FIG. 1 are a device under test 102, a driver output voltage 104, an applied DC voltage 106, and an output current 108.

In FIG. 1, the device under test 102, for example, a buffer cell, is set to logic state "1", and the applied DC voltage 106, for example, a variable voltage source, is set to one of a set of selected voltage values. The set of selected voltage values may be, for example, steps of 0.1 Volts in the range from $-V_{DD}$ to $+2.0$ $V_{DD}$. The output current 108 is measured as a function of the applied DC voltage 106, and the variable voltage output resistance is calculated as the quotient of the applied DC voltage 106 divided by the corresponding output current.

FIG. 2 illustrates a typical plot 200 of variable voltage output resistance as a function of the applied DC voltage 106 for the VVOR model of FIG. 1. Shown in FIG. 2 are data points 202 measured at the selected voltage values of the applied DC voltage 106 and a curve 204 fitted to the data points 202.

In FIG. 2, the fitted curve 204 illustrates the dependence of the variable voltage output resistance as a function of the applied DC voltage 106. Because the variable voltage output resistance is characterized as a DC function, a DC voltage is required to find the corresponding variable voltage output resistance from the curve 204.

FIG. 3 illustrates an aggressor net and a victim net used for crosstalk analysis according to the prior art. Shown in FIG. 3 are an aggressor net 302, a victim net 304, and a coupling capacitance 306.

In FIG. 3, switching transients generated by the aggressor net 302 are coupled by the coupling capacitance 306 as a crosstalk voltage into the victim net 304, which may result in a false signal in the victim net 304. The purpose of crosstalk analysis is to determine whether the crosstalk voltage induced in the victim net 304 will result in a false signal in the victim net 304, so that a design change may be made to avoid or reduce the crosstalk to an acceptable level.

FIG. 4 illustrates a variable voltage output resistance crosstalk model of the prior art for the aggressor net and the victim net of FIG. 3. Shown in FIG. 4 are an aggressor output voltage 402, an aggressor driver resistance 404, an aggressor net capacitance 306 for the aggressor net 302, a coupling capacitance 406, a variable voltage output resistance 410, and a victim net capacitance 412 for the victim net 304.

In FIG. 4, the switching transient of the aggressor output voltage 402 generates a crosstalk voltage waveform at the variable voltage output resistance 410 in the victim net.

FIG. 5 illustrates a plot of the crosstalk voltage waveform at the victim net in response to a switching transient as a function of time for FIG. 4. Shown in FIG. 5 are a switching transient 502 generated by the aggressor output voltage 402, a corresponding crosstalk voltage waveform 504 coupled from the aggressor net to to the variable voltage output resistance 410 in the victim net, and a peak voltage 506.

In FIG. 5, the switching transient 502 in the victim net results when the driver of the aggressor net 302 is switched from a logic "1" state to a logic "0" state. The crosstalk voltage waveform 504 is induced in the victim net 304 via the coupling capacitance 408 in FIG. 4. To calculate the crosstalk voltage waveform on the victim net 304 using circuit modeling computer programs such as SPICE, an accurate estimate of the variable voltage output resistance 410 is required. However, finding the variable voltage output resistance from the curve 204 in FIG. 2 requires a DC voltage. The transient signal represented by the crosstalk voltage waveform 504 must therefore be transformed into an average voltage that may be used to find the value of variable voltage output resistance that corresponds to the crosstalk voltage waveform.

FIG. 6 illustrates a flow chart 600 for a method of determining the variable voltage output resistance in a crosstalk analysis model according to the prior art.

Step 602 is the entry point of the flow chart 600.

In step 604, an initial value of the variable voltage output resistance in the victim net is estimated, for example, the value corresponding to an output voltage of $V_{DD}$ in FIG. 2, or about 14K Ohms.

In step 606, the crosstalk voltage waveform is calculated at the victim driver output using the estimated value of the variable voltage output resistance.

In step 608, an average or equivalent DC voltage is calculated from the crosstalk voltage waveform. Previously, the average voltage has been calculated generally by computing the area under the crosstalk voltage waveform and dividing the area by the time interval of the crosstalk voltage waveform to obtain the average voltage.

In step 610, the average voltage is used to find the corresponding variable voltage output resistance, for example, from the VVOR curve in FIG. 2.

In step 612, the current value of the variable voltage output resistance found in step 610 is compared with the estimated value of VVOR to determine whether the current value of VVOR has converged to within a selected tolerance of the estimated value.

In step 614, if the current value of VVOR has not converged to within a selected tolerance of the estimated value, then control is transferred to step 618. Otherwise, control is transferred to step 616.

In step 616, the estimated value is replaced with the current value of VVOR, and control is transferred to step 606.

Step 618 is the exit point of the flow chart 600.

A disadvantage of the method of FIG. 6 is that the average value calculated for the crosstalk voltage waveform in FIG. 6 is a global average. In accordance with an aspect of the present invention, circuit simulations using SPICE have shown that the variable voltage output resistance is more sensitive to the peak voltage of the crosstalk voltage waveform than to the global average.

FIG. 7 illustrates a plot of a crosstalk voltage waveform 700 at the victim net according to an embodiment of the present invention. Shown in FIG. 7 are a time interval 702 of the crosstalk voltage waveform, a peak voltage 704, a corresponding peak time 706, a selected time interval 708, a first time 710 at the beginning of the selected time interval 708, a second time 712 at the end of the time interval 708, and sides of the peak voltage 714.

In FIG. 7, the peak voltage 704 is the voltage at which the absolute value of the difference between the crosstalk voltage at the corresponding peak time 706 and the average crosstalk voltage is a maximum. Accordingly, a local average value of the crosstalk voltage waveform may be calculated in a time interval near the peak voltage from which a more accurate value for the variable voltage output resistance may be found than that resulting from the global average value.

In one embodiment of the present invention, a method includes steps of:
(a) receiving as input a waveform of a transient signal for an aggressor net as a function of time;
(b) finding a peak value of the waveform and a corresponding peak time of the waveform propagated to a victim net from the aggressor net;
(c) defining a selected time interval within the waveform at the victim net that includes the peak value and excludes features not associated with the peak value wherein the selected time interval begins at a first time and ends at a second time;
(d) calculating a weighted value of a function of the waveform at the first time and the second time;
(e) calculating a local average value of the waveform as a function of the peak value and the weighted value; and
(f) generating as output the local average value of the waveform.

FIG. 8 illustrates a flow chart 800 of a method of estimating a local average crosstalk voltage for a variable voltage output resistance model according to an embodiment of the present invention.

Step 802 is the entry point of the flow chart 800.

In step 804, a waveform of a transient signal for an aggressor net as a function of time is received as input. In this example, the transient signal is the switching voltage at the driver output of the aggressor net, however other types of transient signals may be used in specific applications to practice various embodiments of the present invention within the scope of the appended claims.

In step 806, a peak value of the waveform and a corresponding peak time of the waveform propagated from the aggressor net to a victim net is found according to well-known techniques.

In step 808, a selected time interval within the waveform at the victim net is defined. In this example, the selected time interval 708 within the crosstalk voltage signal waveform 700 is substantially less than the time interval 702 of the crosstalk voltage signal waveform. The selected time interval 708 includes the peak voltage 704 and excludes the portion of the crosstalk voltage signal waveform that does not include features associated with the peak voltage 704. Features associated with the peak voltage 704 include the sides of the peak voltage 714, but do not include the ends of the crosstalk voltage signal that precede and follow the sides of the peak voltage 714. For example, the selected time interval 708 may be five percent of the corresponding peak time 706. Also, the selected time interval 708 is preferably centered on the peak time 706, for example, the first time 710 be 10 picoseconds before the peak time and the second time 712 may be 10 picoseconds after the peak time 706. However, the selected time interval 708 may also be varied as long as the peak time 706 is included in the selected time interval 708.

In step 810, a weighted value of a function of the waveform is calculated at the first time and the second time defining the endpoints of the selected time interval. In this example, the weighted value W of the function of the crosstalk voltage signal waveform 700 is calculated at the first time 710 and the second time 712 as follows:

$$W = W1 * \exp(-|d1|) + W2 * \exp(-|d2|) \tag{1}$$

where W1 and W2 are weighting constants, d1 is the derivative of the crosstalk voltage signal waveform 700 with respect to time evaluated at the first time 710, and d2 is the derivative of the crosstalk voltage signal waveform 700 with respect to time evaluated at the second time 712. The weighting constants W1 and W2 are preferably selected so that W1+W2=1.0. For example, W1=W2=0.5, however, other values for the weighting constants W1 and W2 may be used in specific applications to practice various embodiments of the present invention within the scope of the appended claims. In this example, the absolute values of the derivatives are used to ensure that the total weight W does not exceed W1+W2.

In step 812, a local average value of the waveform as a function of the peak value and the weighted value is calculated. For example, the local average voltage $V_{DC}$ may be calculated as the product of the peak voltage 704 ($V_{PK}$) and the weighted value given by (1):

$$V_{DC} = V_{PK} * W \tag{2}$$

If the values of d1 and d2 are close to zero, then the local average voltage $V_{DC}$ is close to the peak voltage 704. On the other hand, if the values of d1 and d2 are nearly infinite, then the crosstalk voltage waveform is an impulse, which has a DC component of zero.

In step 814, the local average value is generated as output.

Step 816 is the exit point of the flow chart 800.

The local average value of the crosstalk voltage waveform calculated from the flow chart of FIG. 8 may advantageously be substituted for the global average value in the flow chart of FIG. 6 to improve the accuracy of the crosstalk analysis.

In another embodiment of the present invention, a method of estimating a local average crosstalk voltage for a variable voltage output resistance model includes steps of:
(a) receiving as input a crosstalk voltage waveform propagated from an aggressor net to a victim net;
(b) finding a peak voltage value and a corresponding peak time in the crosstalk voltage waveform at the victim net;
(c) defining a selected time interval within the crosstalk voltage waveform that includes the peak voltage value and excludes features of the crosstalk voltage waveform not associated with the peak voltage value wherein the selected time interval begins at a first time and ends at a second time;
(d) calculating a weighted value of a function of the crosstalk voltage waveform at the first time and the second time;
(e) calculating a local average crosstalk voltage as a function of the peak voltage value and the weighted value; and
(f) generating as output the local average crosstalk voltage.

An important feature of the present invention is that the local average value is representative of a DC voltage for which a value of a variable voltage output resistance of the victim net driver is substantially identical to a value of the variable voltage output resistance for the crosstalk voltage waveform, thereby improving the accuracy of the crosstalk analysis.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

In a further embodiment of the present invention, the method of FIG. 8 may be incorporated into a computer program product according to well-known techniques for estimating a local average crosstalk voltage for a variable voltage output resistance model that includes:

a medium for embodying a computer program for input to a computer; and a computer program embodied in the medium for causing the computer to perform steps of:

(a) receiving as input a crosstalk voltage waveform propagated from an aggressor net to a victim net;

(b) finding a peak voltage value and a corresponding peak time in the crosstalk voltage waveform at the victim net;

(c) defining a selected time interval within the crosstalk voltage waveform that includes the peak voltage value and excludes features of the crosstalk voltage waveform not associated with the peak voltage value wherein the selected time interval begins at a first time and ends at a second time;

(d) calculating a weighted value of a function of the crosstalk voltage waveform at the first time and the second time;

(e) calculating a local average crosstalk voltage as a function of the peak voltage value and the weighted value; and (f) generating as output the local average crosstalk voltage.

FIG. 9 illustrates a plot 900 of VVOR error in a SPICE simulation as a function of crosstalk peak voltage. Using the global average voltage, the VVOR error in the curves 904 plotted as triangles is approximately two percent more than obtained using the local average voltage in the curves 902 plotted as diamonds. The VVOR error may be further reduced by removing the outliers circled in the curves 902.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:

(a) receiving as input a waveform of a transient signal as a function of time for an aggressor net;

(b) finding a peak value of the waveform and a corresponding peak time of the waveform propagated from the aggressor net to a victim net;

(c) defining a selected time interval within the waveform at the victim net that includes the peak value and excludes features of the waveform not associated with the peak value wherein the selected time interval begins at a first time and ends at a second time;

(d) calculating a weighted value of a function of the waveform evaluated at the first time and the second time;

(e) calculating a local average value of the waveform as a function of the peak value and the weighted value; and (f) generating as output the local average value of the waveform.

2. The method of claim 1 wherein the selected time interval is equal to about 5 percent of the peak time.

3. The method of claim 1 wherein the selected time interval is centered on the peak time.

4. The method of claim 1 wherein the function of the waveform is a first derivative with respect to time.

5. The method of claim 1 wherein the weighted value is substantially equal to $W1*\exp(-|d1|)+W2*\exp(-|d2|)$ wherein W1 and W2 are weighting constants, d1 is a value of the function of the waveform at the first time, and d2 is a value of the function of the waveform at the second time.

6. The method of claim 5 wherein W1=W2=0.5.

7. The method of claim 1 wherein the function of the peak value and the weighted value is a product of the peak value multiplied by the weighted value.

8. The method of claim 1 wherein the transient signal is a crosstalk voltage signal propagated from an aggressor net to a driver output in a victim net.

9. The method of claim 8 wherein the local average value of the waveform is representative of a DC voltage for which a value of a variable voltage output resistance of a driver output in a victim net is substantially identical to a value of the variable voltage output resistance for the crosstalk voltage signal.

10. A method of estimating a local average crosstalk voltage for a variable voltage output resistance model comprising steps of:

(a) receiving as input a crosstalk voltage waveform propagated from an aggressor net to a victim net;

(b) finding a peak voltage value and a corresponding peak time in the crosstalk voltage waveform at the victim net;

(c) defining a selected time interval within the crosstalk voltage waveform that includes the peak voltage value and excludes features of the crosstalk voltage waveform not associated with the peak voltage value wherein the selected time interval begins at a first time and ends at a second time;

(d) calculating a weighted value of a function of the crosstalk voltage waveform at the first time and the second time;

(e) calculating a local average crosstalk voltage as a function of the peak voltage value and the weighted value; and (f) generating as output the local average crosstalk voltage.

11. The method of claim 10 wherein the selected time interval is equal to about 5 percent of the peak time.

12. The method of claim 10 wherein the selected time interval is centered on the peak time.

13. The method of claim 10 wherein the function of the crosstalk voltage waveform is a first derivative with respect to time.

14. The method of claim 10 wherein the weighted value is substantially equal to $W1*\exp(-|d1|)+W2*\exp(-|d2|)$ wherein W1 and W2 are weighting constants, d1 is a value of the function of the crosstalk voltage waveform at the first time, and d2 is a value of the function of the crosstalk voltage waveform at the second time.

15. The method of claim 14 wherein W1=W2=0.5.

16. The method of claim 10 wherein the function of the peak value and the weighted value is a product of the peak value multiplied by the weighted value.

17. The method of claim 16 wherein the local average value of the crosstalk voltage waveform is representative of a DC voltage for which a value of a variable voltage output resistance of a driver output in a victim net is substantially identical to a value of the variable voltage output resistance for the crosstalk voltage signal.

18. A computer program product for estimating a local average crosstalk voltage for a variable voltage output resistance model comprising:
   a medium for embodying a computer program for input to a computer; and
   a computer program embodied in the medium for causing the computer to perform steps of:
   (a) receiving as input a crosstalk voltage waveform propagated from an aggressor net to a victim net;
   (b) finding a peak voltage value and a corresponding peak time in the crosstalk voltage waveform at the victim net;
   (c) defining a selected time interval within the crosstalk voltage waveform that includes the peak voltage value and excludes features of the crosstalk voltage waveform not associated with the peak voltage value wherein the selected time interval begins at a first time and ends at a second time;
   (d) calculating a weighted value of a function of the crosstalk voltage waveform at the first time and the second time;
   (e) calculating a local average crosstalk voltage as a function of the peak voltage value and the weighted value; and
   (f) generating as output the local average crosstalk voltage.

19. The computer program product of claim 18 wherein the local average value of the crosstalk voltage waveform is representative of a DC voltage for which a value of a variable voltage output resistance of a driver output in a victim net is substantially identical to a value of the variable voltage output resistance for the crosstalk voltage signal.

* * * * *